United States Patent
Tsunoda et al.

(10) Patent No.: US 9,600,042 B2
(45) Date of Patent: Mar. 21, 2017

(54) CASING FOR ELECTRONIC DEVICE

(71) Applicant: FUJITSU LIMITED, Kawasaki-shi, Kanagawa (JP)

(72) Inventors: Yosuke Tsunoda, Tachikawa (JP); Jie Wei, Hachioji (JP); Masumi Suzuki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 20 days.

(21) Appl. No.: 14/559,210

(22) Filed: Dec. 3, 2014

(65) Prior Publication Data
US 2015/0195952 A1 Jul. 9, 2015

(30) Foreign Application Priority Data

Jan. 8, 2014 (JP) .................................. 2014-001857

(51) Int. Cl.
*G06F 1/20* (2006.01)
*H05K 7/20* (2006.01)
*H05K 5/06* (2006.01)

(52) U.S. Cl.
CPC ......... *G06F 1/203* (2013.01); *H05K 7/20163* (2013.01); *H05K 5/06* (2013.01); *H05K 7/20972* (2013.01)

(58) Field of Classification Search
CPC .............. G06F 1/203; G06F 2200/201; H05K 7/20963–7/20972; H05K 7/20136–7/20163
USPC ...... 361/679.46–679.54, 688–723; 165/80.2; 174/547–548; 455/575.1, 550.1, 347; 379/433.01, 433.12
See application file for complete search history.

(56) References Cited

U.S. PATENT DOCUMENTS

| | | | | |
|---|---|---|---|---|
| 5,689,403 | A * | 11/1997 | Robertson, Jr. | ........ H04B 1/036 361/695 |
| 7,872,864 | B2 * | 1/2011 | Mongia | ..................... G06F 1/20 361/694 |
| 8,189,331 | B2 * | 5/2012 | Senatori | .................. G06F 1/203 165/104.34 |
| 8,837,140 | B2 * | 9/2014 | Zurowski | ........... H05K 7/20154 361/679.49 |
| 2006/0011330 | A1 * | 1/2006 | Wang | .................... H01L 23/467 165/122 |
| 2007/0171614 | A1 * | 7/2007 | Pedoeem | ................ H04L 12/18 361/695 |

(Continued)

FOREIGN PATENT DOCUMENTS

JP 2004-119844 A 4/2004
JP 2007-324339 A 12/2007

*Primary Examiner* — Zachary M Pape
(74) *Attorney, Agent, or Firm* — Squire Patton Boggs (US) LLP

(57) ABSTRACT

An electronic device includes: a heating element; a casing including a tightly sealed waterproof compartment where the heating element is disposed and a ventilation chamber being disposed adjacent to the waterproof compartment to allow outside air to flow; and a heat dissipation member provided at a side of the waterproof compartment of a partition wall partitioning the waterproof compartment and the ventilation chamber, wherein the heating element is disposed on the heat dissipation member and a thickness of the partition wall at a position where at least the heating element is disposed is thinner than that of other portions of the partition wall.

14 Claims, 10 Drawing Sheets

(56) References Cited

U.S. PATENT DOCUMENTS

| | | | |
|---|---|---|---|
| 2008/0019093 A1 | 1/2008 | Hongo | |
| 2011/0108250 A1* | 5/2011 | Horng | G06F 1/28 165/121 |
| 2011/0176279 A1* | 7/2011 | Zhao | H01L 21/4878 361/720 |
| 2014/0235156 A1* | 8/2014 | Li | H05K 7/20154 454/184 |
| 2015/0017905 A1* | 1/2015 | Li | H05K 7/20136 454/184 |

* cited by examiner

CASING FOR ELECTRONIC DEVICE

CROSS-REFERENCE TO RELATED APPLICATION

This application is based upon and claims the benefit of priority of the prior Japanese Patent Application No. 2014-001857 filed on Jan. 8, 2014, the entire contents of which are incorporated herein by reference.

FIELD

The embodiments discussed herein are related to an electronic device.

BACKGROUND

An electronic device is known to include a casing provided with a waterproof compartment and an electronic component disposed in the waterproof compartment.

In such type of electronic device, a heat spot may occur in which temperature of the casing is partially increased to a high level by the heat generated from a heating element such as the electronic component. As a countermeasure against the occurrence of heat spot, for example, it may be considered that a sheet-shaped heat dissipation member is attached on an inner wall surface of the waterproof compartment to diffuse the heat of the heating element to the casing by the heat dissipation member.

However, attaching a sheet-shaped heat dissipation member to an inner wall surface of the waterproof compartment alone may not sufficiently suppress a heat spot which occurs in the reverse side of the casing.

The following are reference documents: [Document 1] Japanese Laid-Open Patent Publication No. 2007-324339 and [Document2] Japanese Laid-Open Patent Publication No. 2004-119844.

SUMMARY

According to an aspect of the invention, an electronic device includes: a heating element; a casing including a tightly sealed waterproof compartment where the heating element is disposed and a ventilation chamber being disposed adjacent to the waterproof compartment to allow outside air to flow; and a heat dissipation member provided at a side of the waterproof compartment of a partition wall partitioning the waterproof compartment and the ventilation chamber, wherein the heating element is disposed on the heat dissipation member and a thickness of the partition wall at a position where at least the heating element is disposed is thinner than that of other portions of the partition wall.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A first embodiment will be described first.

Figure 1:
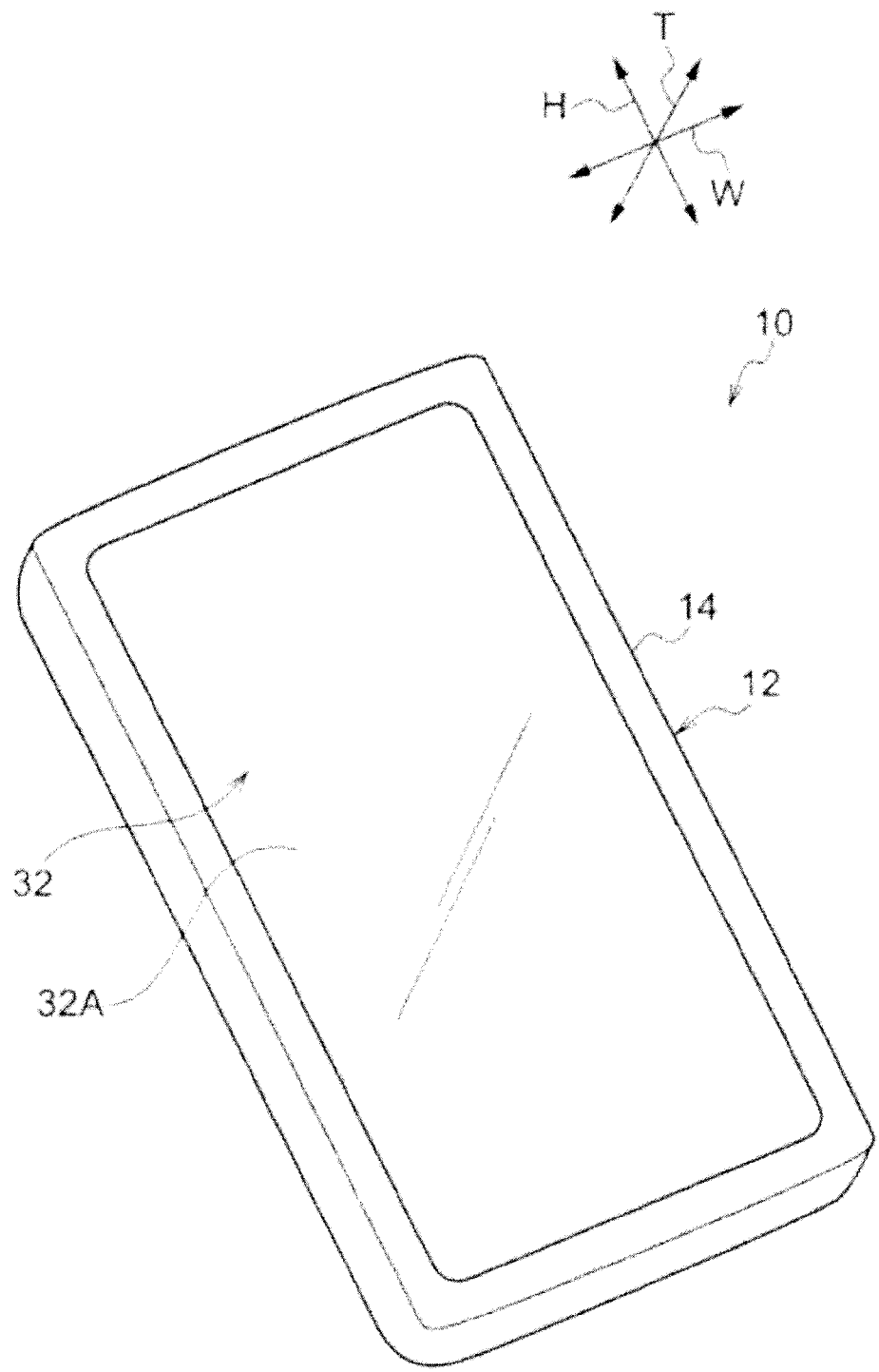
FIG. 1 is a perspective view illustrating an electronic device according to a first embodiment.
Figure 2:
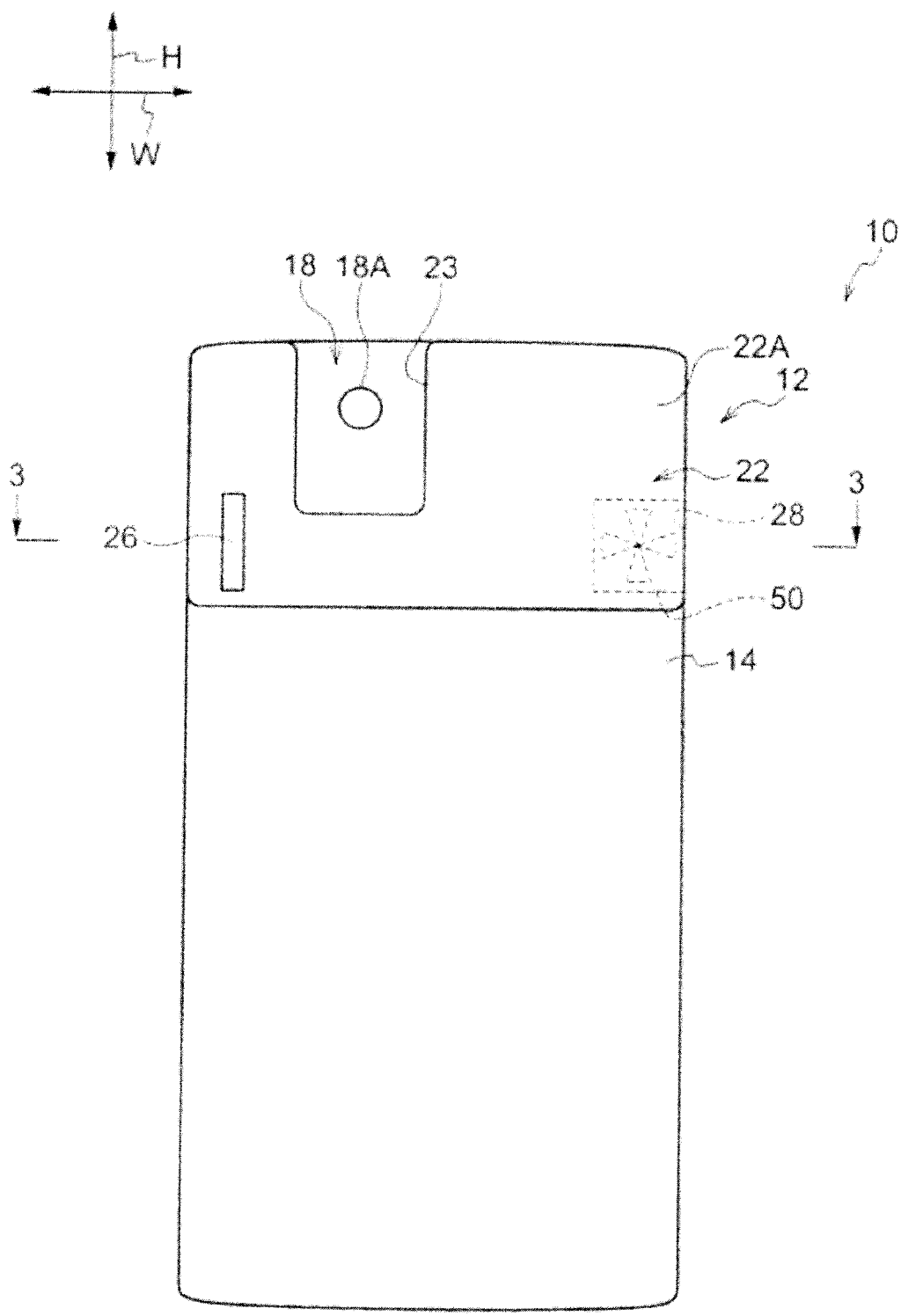
FIG. 2 is a plan view when viewing from a rear side of the electronic device illustrated in FIG. 1.
Figure 3:
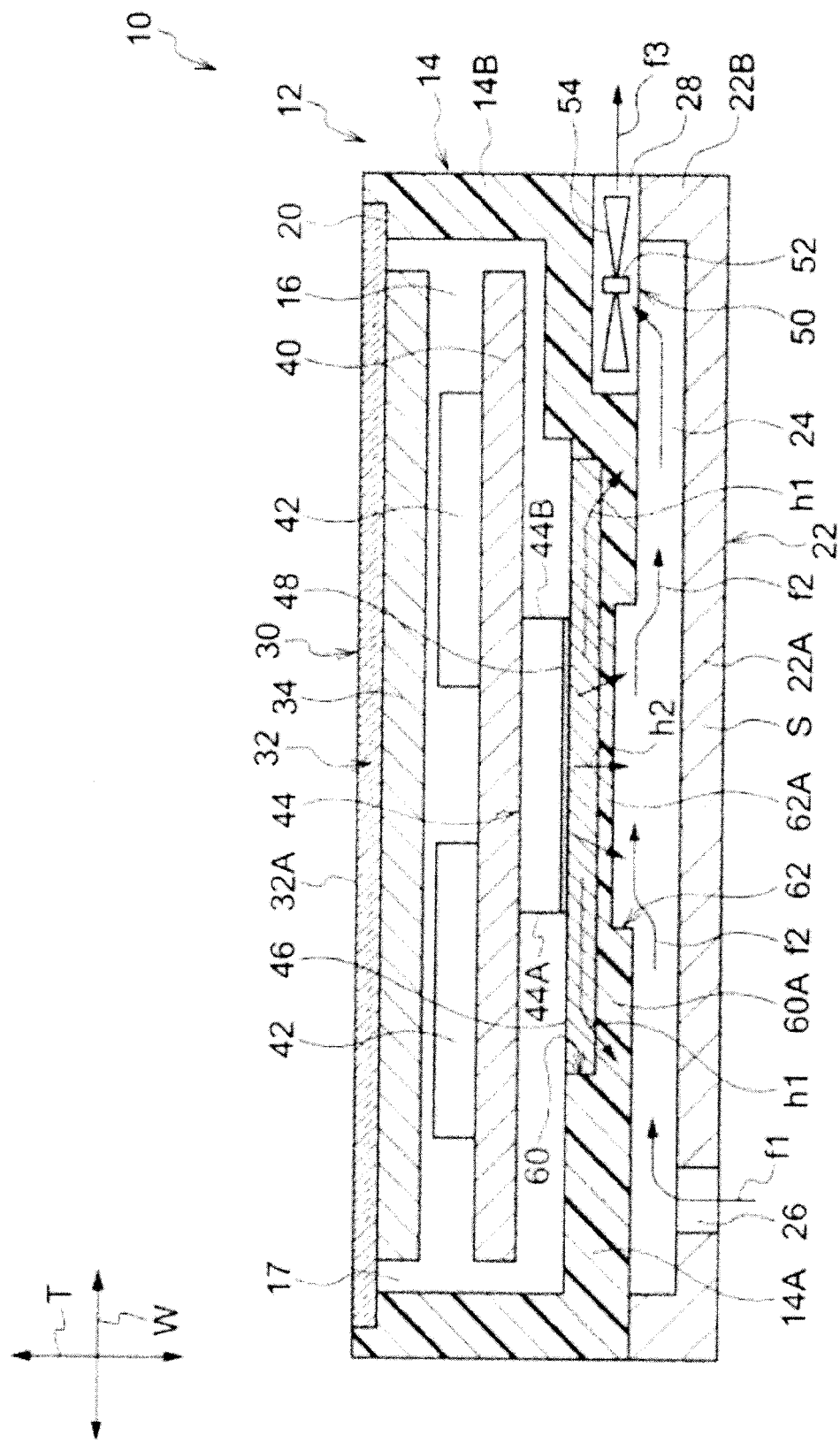
FIG. 3 is a cross-sectional view taken along line 3-3 of FIG. 2.

As illustrated in FIG. 1 and FIG. 2, an electronic device 10 according to the present embodiment is, for example, a portable electronic device (portable terminal). The electronic device 10 includes a casing 12. As illustrated in FIG. 3, the casing 12 includes a main body casing 14 provided with a waterproof compartment 16 and a rear cover 22 which forms a ventilation chamber 24 adjacent to the waterproof compartment 16 by being attached to a rear side of the main body casing 14.

Further, an arrow W represented appropriately in each drawing represents a lateral direction (width direction) of the electronic device 10, an arrow H represents a longitudinal direction (height direction) of the electronic device and an arrow T represents a thickness direction (front and rear direction) of the electronic device 10. Further, a manipulation surface 32A side which will be described later is defined as a front side of the electronic device 10 and a side opposite to the manipulation surface 32A is defined as a rear side of the electronic device 10.

The main body casing 14 is made of, for example, resin, and formed in a thin box shape. The main body casing 14 includes a partition wall portion 14A which partitions the waterproof compartment 16 and the ventilation chamber 24. The main body casing also includes a circumferential side wall 14B extending from the outer peripheral edge portion of the partition wall portion 14A to the front side of the electronic device 10. The partition wall portion 14A is disposed between the waterproof compartment 16 and the ventilation chamber 24. The partition wall portion 14A does not include an opening portion and partitions the waterproof compartment 16 and the ventilation chamber 24 without a gap. The circumferential side wall 14B is formed in an annular shape over the entire outer peripheral edge portion of the partition wall portion 14A. Further, the resin constituting the partition wall portion 14A may be the material which allows heat to be easily conducted as compared to a resin constituting the circumferential side wall 14 B.

A mounting opening 17 is formed on the front side of the main body casing 14. The touch panel module 30 is disposed on the mounting opening 17. The touch panel module 30 includes a glass panel 32 and a touch panel 34. The glass panel 32 includes the manipulation surface 32A manipulated with the touch of a finger by a manipulator. An outer circumference of the glass panel 32 is air-tightly joined to a step portion 20 formed on an end portion of the circumferential side wall 14B through a seal member which is not illustrated. Accordingly, the waterproof compartment 16 which is sealed is formed within the main body casing 14.

The touch panel 34 is disposed on the rear side of the glass panel 32. The touch panel 34 is integrally provided with a display such as a liquid crystal display which displays images or moving pictures on the manipulation surface 32A. The touch panel 34 detects, for example, a contact position of fingers of the manipulator with respect to the manipulation surface 32A. Further, the touch panel 34 and the display may be provided with separate units.

A substrate 40 is disposed between the touch panel 34 and the partition wall portion 14A. The substrate 40 is disposed to face the partition wall portion 14A of the main body casing 14. A plurality of electronic components 42 and 44, such as for example, a CPU (Central Processing Unit) and a memory, are mounted on the front side and the rear side of the substrate 40, respectively. Each of the electronic components 42 and 44 consumes electricity supplied from a battery which is not illustrated to generate heat. Further, the electronic component 44 is an example of a heating element.

The rear cover 22 includes an outer wall portion 22A facing the partition wall portion 14A and the circumferential side wall 22B extending from the peripheral edge portion of the outer wall portion 22A to the partition wall portion 14A side. The circumferential side wall 22B is formed in an annular shape over the entire outer peripheral edge portion of the outer wall portion 22A. The rear cover 22 is attached to the rear side of the main body casing 14. Accordingly, the ventilation chamber 24 adjacent to the waterproof compartment 16 is formed in the rear side of the main body casing 14 with being spaced apart from the partition wall portion 14A.

Further, as illustrated in FIG. 2, the rear cover 22 is attached to the rear side in a portion above the main body casing 14. In the rear cover 22, a notch 23 through which a lens 18A of a camera 18 installed on the main body casing 14 is exposed is formed. Further, the rear cover 22 is an example of a cover.

Figure 4:
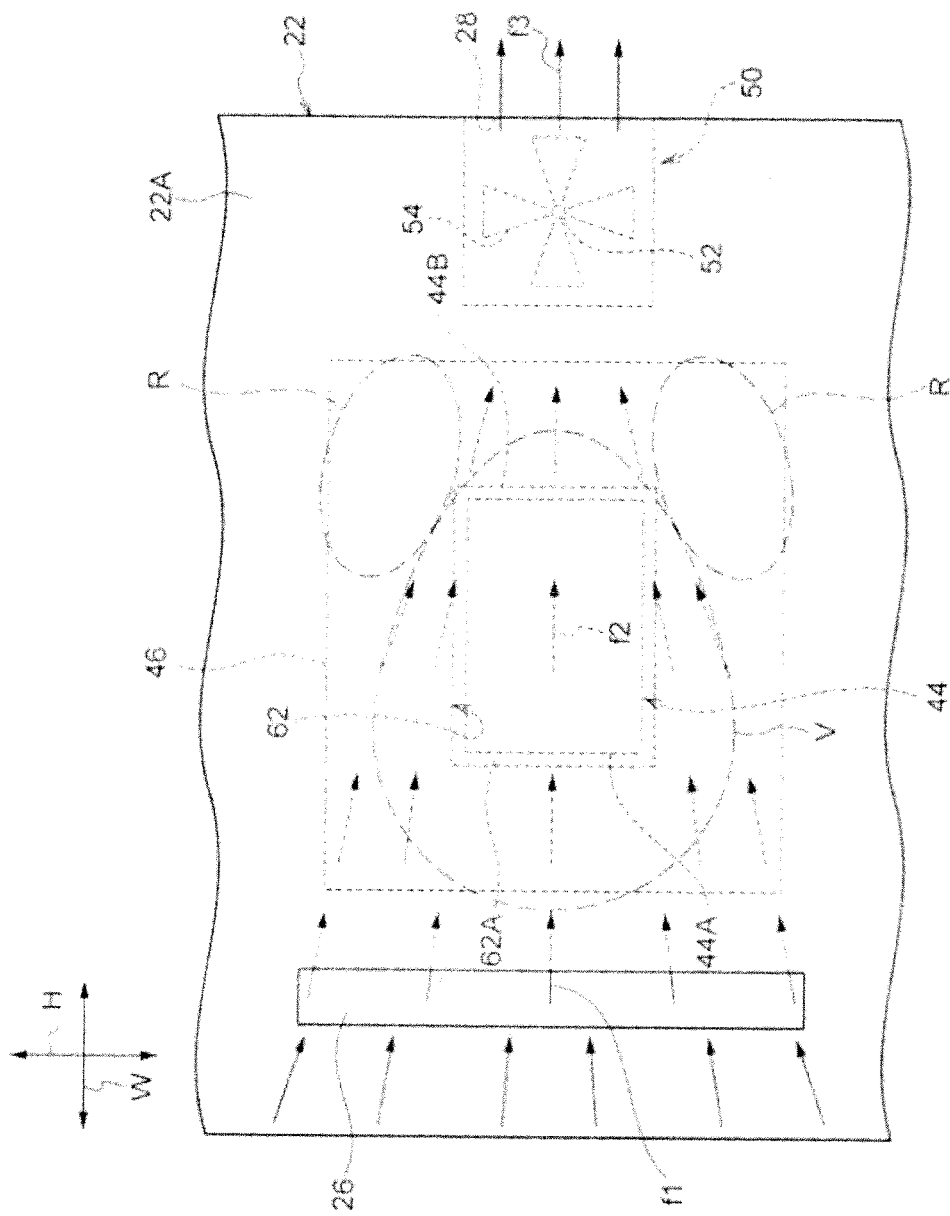
FIG. 4 is an enlarged view of FIG. 2.

As illustrated in FIG. 4, an intake port 26 which takes outside air into the ventilation chamber 24 is formed at one side of the outer wall portion 22A of the rear cover 22 in the width direction. The intake port 26 is formed into a rectangular shape along the height direction of the electronic device 10. The intake port 26 is disposed at one side of the electronic component 44 and a heat dissipation plate 46 to be described later when viewing the electronic device 10 from the rear side.

Further, the exhaust port 28 which exhausts outside air within the ventilation chamber 24 to outside is formed in the rear cover 22. The exhaust port 28 is formed on a circumferential side wall 22B which is located at a side which is opposite to the intake port 26 regarding the electronic component 44 and the heat dissipation plate 46 when viewing the electronic device 10 from the rear side. An outside air flow passage in which outside air flows is formed between the intake port 26 and the exhaust port 28.

Further, a blower 50 is provided in the ventilation chamber 24. The blower 50 includes a rotating shaft 52 and a plurality of blades 54 rotating integrally with the rotating shaft 52. The blower 50 is provided at, for example, the exhaust port 28 side in the ventilation chamber 24. That is, in the present embodiment, when viewing the partition wall portion 14A in the wall thickness direction, the intake port 26 is disposed at one side of the electronic component 44 and the heat dissipation plate 46, and the exhaust port 28 and the blower 50 are disposed at the other side of the electronic component 44 and the heat dissipation plate 46.

Also, when the blower 50 operates, outside air is introduced from the intake port 26 into the ventilation chamber 24 and the introduced outside air is exhausted from the exhaust port 28 to outside of the ventilation chamber 24. That is, when the blower 50 operates, the ventilation chamber 24 is ventilated. Further, the arrangement of the intake port 26, the exhaust port 28 and the blower 50 may be changed appropriately. Further, the blower 50 may be subjected to a waterproofing treatment.

Here, as illustrated in FIG. 3, the heat dissipation plate 46 formed in a plate shape is provided on the waterproof compartment 16 side of the partition wall portion 14A which partitions the waterproof compartment 16 and the ventilation chamber 24. The heat dissipation plate 46 is made of, for example, a metal plate such as aluminum having a thermal conductivity higher than the partition wall portion 14A. The heat dissipation plate 46 is disposed along a bottom wall portion 60A of the mounting recess 60 formed in the partition wall portion 14A, and is attached to the mounting recess 60.

Further, the heat dissipation plate 46 may be integrally formed with the partition wall portion 14A by, for example, an insert molding. Further, the heat dissipation plate 46 may be adhered to, for example, the bottom wall portion 60A of the mounting recess 60 by an adhesive.

The electronic component 44 is attached to the central portion of the heat dissipation plate 46 through a heat transfer member 48. That is, the electronic component 44 is thermally connected with the central portion of the heat dissipation plate 46 through the heat transfer member 48. Further, the heat dissipation plate 46 extends outside of the outer circumference of the electronic component 44 when viewing the partition wall portion 14A in the wall thickness direction. Accordingly, as illustrated by the arrows h1 and h2, the heat of the electronic component 44 is diffusively transferred to the bottom wall portion 60A of the mounting recess 60 through the heat transfer member 48 and the heat dissipation plate 46, and is released to the ventilation chamber 24.

Further, when viewing the partition wall portion 14A in the wall thickness direction, the heat dissipation plate 46 may have the same size (dimension) as that of the heating element 44. In such a case, as illustrated by only the arrow h2, the heat of the electronic component 44 is transferred to the bottom wall portion 60A of the mounting recess 60 through the heat transfer member 48 and the heat dissipation plate 46 and is released to the ventilation chamber 24. Further, the expression of the "same size" is a concept to include a difference caused by, for example, manufacturing errors of the heat dissipation plate 46 and the heating element 44.

Further, a heat transfer grease or a heat transfer sheet made of, for example, silicon having a higher thermal conductivity, is utilized as the heat transfer member 48.

The outer recess 62 is formed at the ventilation chamber 24 side in the bottom wall portion 60A of the mounting recess 60. A thin wall portion 62A having a wall thickness thinner than other portions of the bottom wall portion 60A is formed on the bottom wall portion 60A of the mounting recess 60 by the outer recess 62. The thin wall portion 62A faces the electronic component 44 by interposing the heat dissipation plate 46 therebetween. Accordingly, as illustrated by the arrow h2, the heat dissipation efficiency of the heat dissipated from the electronic component 44 through the thin wall portion 62A to the ventilation chamber 24 is increased.

Further, as illustrated in FIG. 4, when viewing the partition wall portion 14A in the wall thickness direction, the thin wall portion 62A overlaps with the entirety of the electronic component 44. Accordingly, the heat dissipation efficiency of the heat dissipated from the electronic component 44 through the thin wall portion 62A to the ventilation chamber 24 is further increased.

Next, operations of the first embodiment will be described.

As illustrated in FIG. 3, the substrate 40 on which a plurality of electronic components 42 and 44 are mounted is disposed in the waterproof compartment 16. Accordingly, the substrate 40 and the plurality of electronic components 42 and 44 are waterproofed. As a result, for example, a breakage of the substrate 40 and a plurality of the electronic components 42 and 44 caused by, for example, water is suppressed.

However, the electronic components 42 and 44 may be subjected to a heat treatment in the waterproof compartment 16. Especially, as the electronic device 10 is made thinner, when a gap between the electronic component 44 mounted on of the substrate 40 and the outer wall portion 22A of the rear cover 22 with which fingers of the manipulator contact becomes narrower, it is concerned about the followings. That is, a heat spot may occur in which a temperature of a portion (hereinafter referred to as the "facing part") S of the outer wall portion 22A facing the electronic component 44 is partially increased to a high level by the heat generated by the electronic component 44.

As a countermeasure against the occurrence of the heat spot, in the present embodiment, the heat dissipation plate 46 is provided on the waterproof compartment 16 side in the partition wall portion 14A. The electronic component 44 is attached to the central portion of the heat dissipation plate 46 through the heat transfer member 48. The heat dissipation plate 46 further extends outside of the outer circumference of the electronic component 44. Accordingly, as illustrated by the arrow h1, the heat of the electronic component 44 is diffusively transferred over a wide range of the partition wall portion 14A through the heat transfer member 48 and the heat dissipation plate 46. Accordingly, an increase of temperature of the facing portion S of the rear cover 22 is suppressed. That is, an occurrence of the heat spot at the facing portion S of the rear cover 22 is suppressed.

Further, the ventilation chamber 24 in which outside air flows is formed between the partition wall portion 14A and the outer wall portion 22A of the rear cover 22. A heat-insulation layer is formed in the ventilation chamber 24 by outside air. Accordingly, an increase of temperature of the facing portion S of the rear cover 22 is further reduced.

Further, the blower 50 is installed in the ventilation chamber 24. When the blower 50 operates, outside air is introduced into the ventilation chamber 24 from the intake port 26 as illustrated by the arrow f1. The outside air introduced into the ventilation chamber 24 flows along the partition wall portion 14A as illustrated by the arrow f2 and then, is exhausted from the exhaust port 28 to the outside of the ventilation chamber 24 as illustrated by the arrow f3.

In this case, the heat in the partition wall portion 14A and the facing portion S of the rear cover 22 is dissipated by the outside air (arrow f2) flowing along the partition wall portion 14A. As a result, the electronic component 44 which is a heat source is cooled down and the facing portion S of the rear cover 22 is directly cooled down. That is, when the blower 50 operates, the ventilation chamber 24 is ventilated, and the electronic component 44 and the facing portion S of the rear cover 22 are forcedly cooled down.

As described above, in the present embodiment, an occurrence of the heat spot which occurs at the facing portion of the rear cover 22 may be suppressed while securing waterproofness of the waterproof compartment 16.

Further, when the heat dissipation plate 46 is disposed on the mounting recess 60 formed in the partition wall portion 14A, the main body casing 14 may be made thin. Further, the thin wall portion 62A having a wall thickness which is thinner than other portions of the bottom wall portion 60A is formed on a portion facing the electronic component 44 in the bottom wall portion 60A of the mounting recess 60. Accordingly, as illustrated by an arrow h2, the heat dissipation efficiency of the heat dissipated from the electronic component 44 through the thin wall portion 62A to the ventilation chamber 24 is increased. As a result, it is possible to increase the cooling efficiency of the electronic component 44.

Further, as illustrated in FIG. 4, the thin wall portion 62A overlaps with the entirety of the electronic component 44 when viewing the partition wall portion 14A in the wall thickness direction. Accordingly, the heat dissipation efficiency of the heat dissipated from the electronic component 44 through the thin wall portion 62A to the ventilation chamber 24 may be further increased.

Further, when the thin wall portion 62A is partially formed in the bottom wall portion 60A of the mounting recess 60, it is possible to reduce the decrease of strength of the partition wall portion 14A. That is, in the present embodiment, the strength of the partition wall portion 14A may be secured while increasing the cooling efficiency of the electronic component 44.

Further, a scheme of, for example, forming an opening portion in the partition wall portion 14A and exposing the heat dissipation plate 46 to the ventilation chamber 24 may be considered in order to increase the heat dissipation efficiency of the electronic component 44 with respect to the ventilation chamber 24. However, when the opening portion is formed in the partition wall portion 14A, substances such as water may be easily infiltrated into the waterproof compartment 16 from the gap between the heat dissipation plate 46 and the partition wall portion 14A through the opening portion.

As a countermeasure against the infiltration of water, when a gap between the heat dissipation plate 46 and the partition wall portion 14A is sealed with, for example, seal materials, the structure of the electronic device 10 may become complicated that may result in the increase of a manufacturing cost. In contrast, in the present embodiment, since the opening portion is not formed in the partition wall portion 14A, the structure of the electronic device 10 may be simplified.

However, in order to suppress an occurrence of the heat spot which occurs at the facing portion S of the rear cover 22, as described above, the heat dissipation plate 46 is formed to be larger than the electronic component 44, and the heat of the electronic component 44 may be diffused over a wide range of the partition wall portion 14A. In contrast, in the present embodiment, as illustrated by a broken line in FIG. 4, an area R is formed where the outside air is hard to flow to the ventilation chamber 24 in the periphery of the electronic component 44. When the thin wall portion 62A is provided in an area right below the area R, an amount of heat discharged from the waterproof compartment 16 to the area R is increased, and the heat spot may occur at the outer wall portion 22A of the rear cover 22.

As a countermeasure against the occurrence of the heat spot, in the present embodiment, as illustrated by the broken line, the thin wall portion 62A is provided only in an area right below an area V where the outside air flows among the ventilation chamber 24. Accordingly, it is possible to suppress an occurrence of the heat spot in an area near the area R. Further, it is possible to suppress the heat spot from occurring near the area R in such a way that the size of the heat dissipation plate 46 is adjusted so as not to reach a location right below the area R, and an amount of the heat discharged from the waterproof compartment 16 to the area R is decreased.

Figure 5:
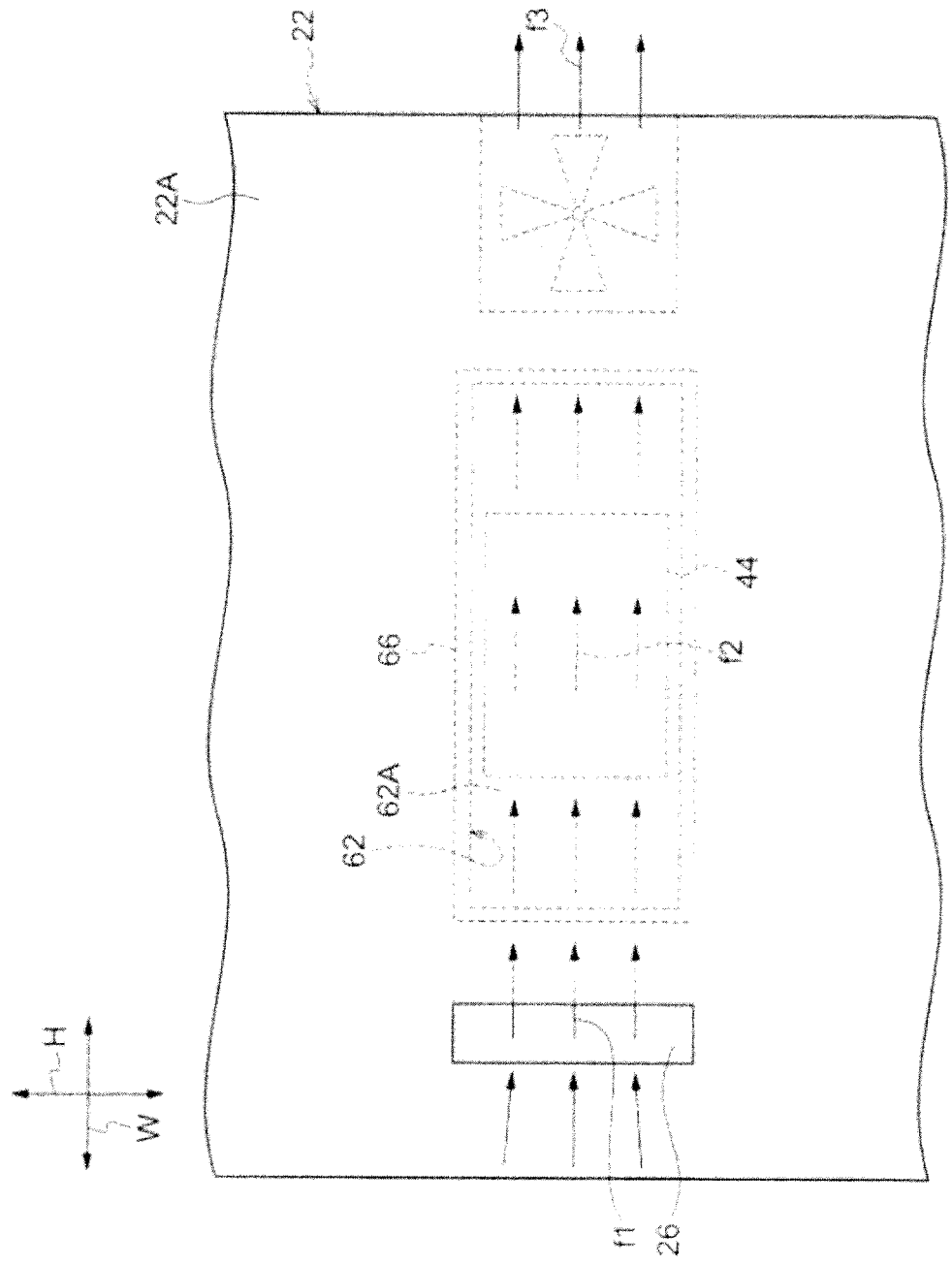
FIG. 5 is an enlarged view illustrating a modified example of a heat dissipation plate according to the first embodiment and corresponds to FIG. 4.

Further, as illustrated in FIG. 5, when the heat dissipation plate 66 is disposed along, for example, the outside air flow passage in which outside air flows, the thin wall portion 62A may be made larger along the longitudinal direction of the heat dissipation plate 66. As a result, the cooling efficiency of the electronic component 44 may be increased.

Next, a second embodiment will be described. Further, the same constitutional elements as those of the first embodiment are assigned the same reference numerals and descriptions thereof will be omitted.

Figure 6:
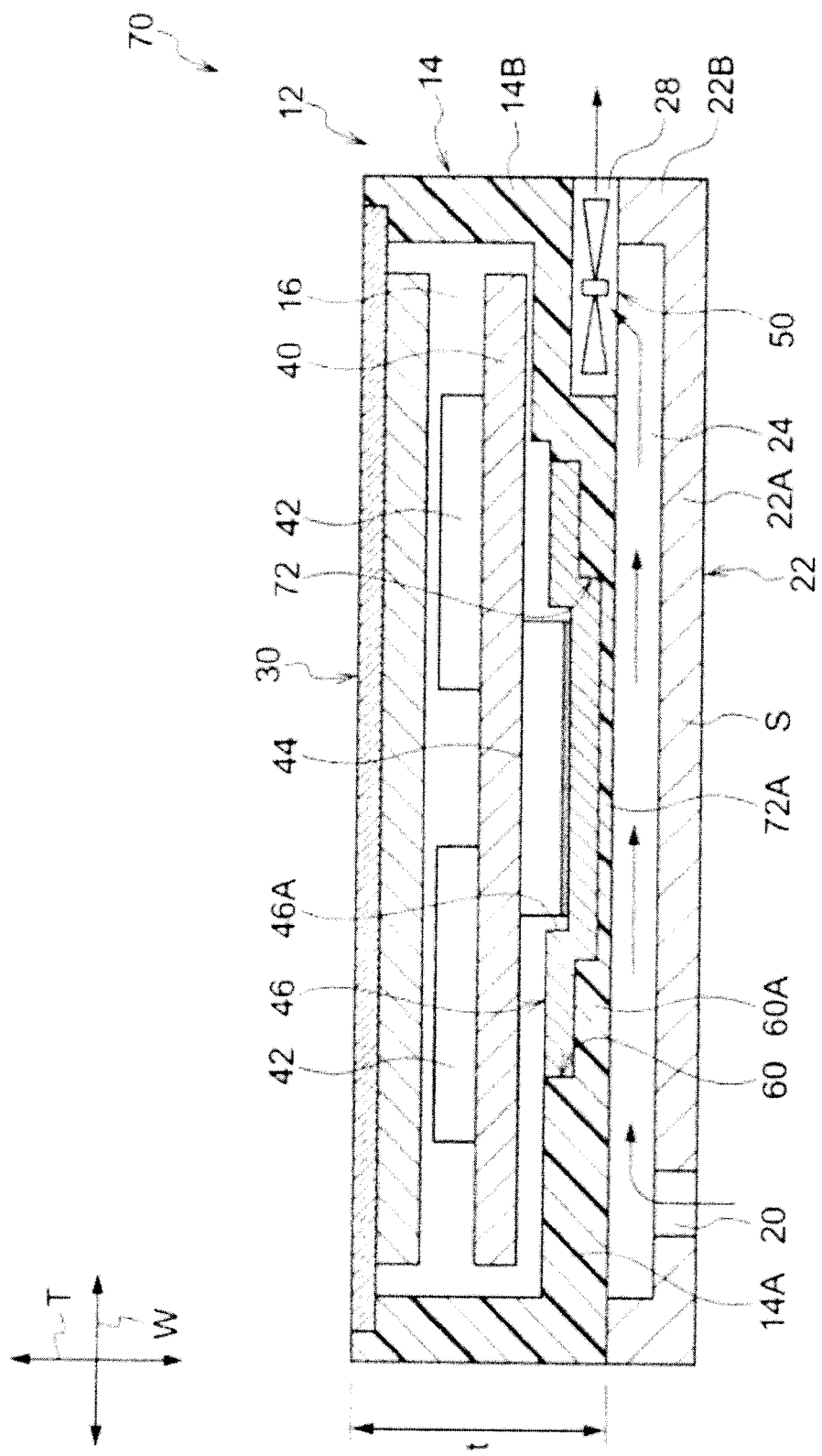
FIG. 6 is a cross-sectional view illustrating the electronic device according to a second embodiment and corresponds to FIG. 3.

As illustrated in FIG. 6, in an electronic device 70 according to a second embodiment, an inner recess 72 is formed at the waterproof compartment 16 side in the bottom wall portion 60A of the mounting recess 60. A thin wall portion 72A having a wall thickness thinner than other portions of the bottom wall portion 60A is formed on the bottom wall portion 60A of the mounting recess 60 by the inner recess 72. The thin wall portion 72A faces the electronic component 44 by interposing the heat dissipation plate 46 therebetween. Accordingly, the heat dissipation efficiency of the heat dissipated to the ventilation chamber 24 through the thin wall portion 72A is increased in the electronic component 44.

Further, the accommodating recess 46A recessed toward the inner recess 72 is formed in the central portion of the heat dissipation plate 46. The accommodating recess 46A is formed by, for example, a press molding. The electronic component 44 is disposed in the accommodating recess 46A. Accordingly, the thickness "t" of the main body casing 14 may be made thinner as compared to the first embodiment (see, for example, FIG. 3).

As described above, in the present embodiment, the main body casing 14 may be made thin while increasing the cooling efficiency of the electronic component 44 by the thin wall portion 72A.

Next, a third embodiment will be described. Further, the same constitutional elements as those of the first embodiment are assigned the same reference numerals and descriptions thereof will be omitted.

Figure 7:
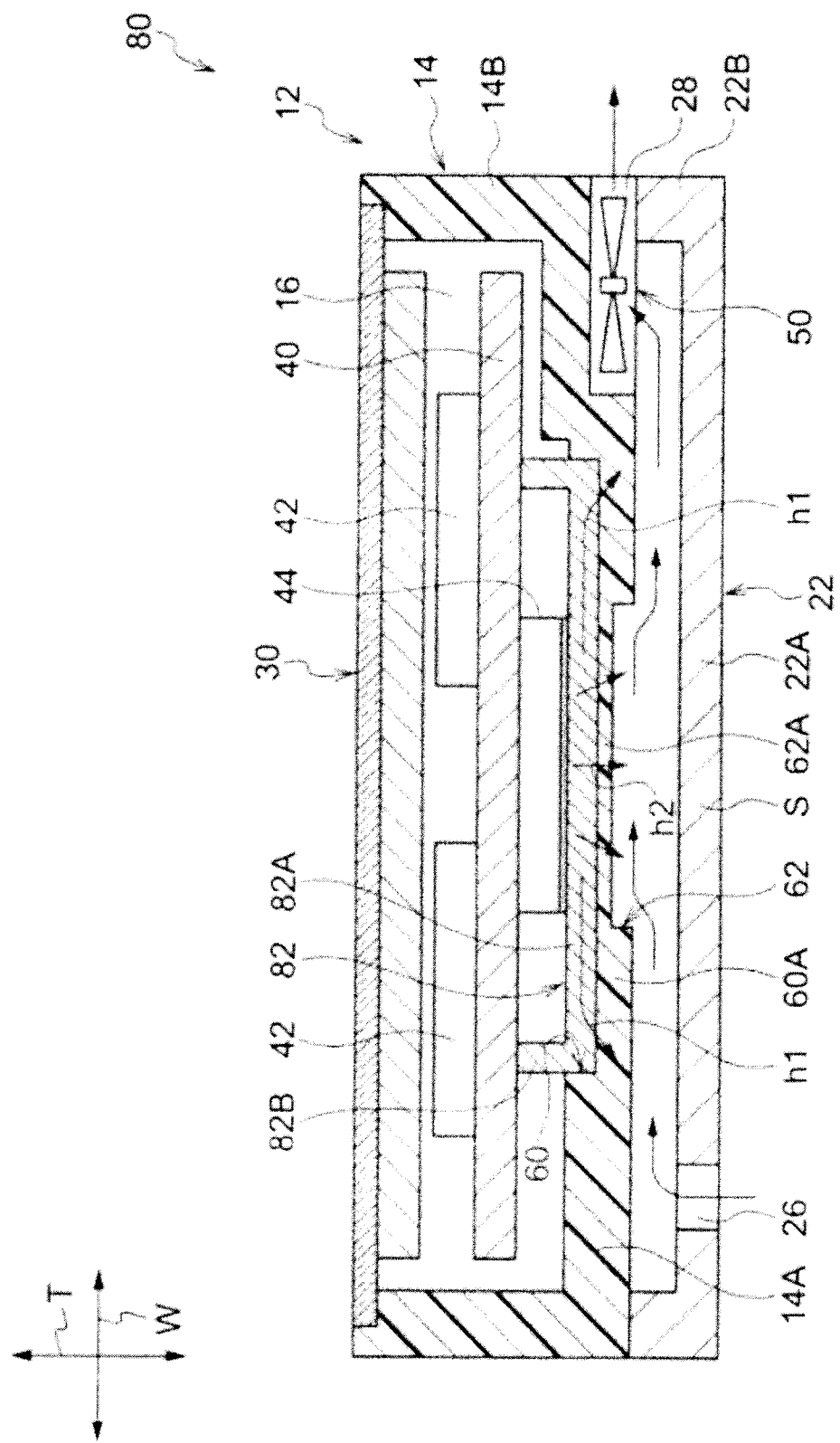
FIG. 7 is a cross-sectional view illustrating the electronic device according to a third embodiment and corresponds to FIG. 3.

As illustrated in FIG. 7, according to the third embodiment, the shield member 82 which blocks, for example, electromagnetic waves, is provided on the waterproof compartment 16 side in the partition wall portion 14A in an electronic device 80. The shield member 82 is formed of a plate made of metal such as, for example, aluminum having a thermal conductivity higher than the partition wall portion 14A. Further, the shield member 82 is formed in a thin box shape in which the substrate 40 side is opened.

Specifically, the shield member 82 includes a top wall 82A disposed along the bottom wall portion 60A of the mounting recess 60 and a circumferential side wall 82B extending from the outer peripheral edge portion of the top wall 82A to the substrate 40 side. The shield member 82 is attached to the substrate 40 to cover the electronic component 44 in a state where the top wall 82A faces the electronic component 44. Accordingly, the heat of the electronic component 44 is diffusively transferred to the partition wall portion 14A through the top wall 82A of the shield member 82. Accordingly, the same effect as that in the first embodiment may be obtained.

As described above, in the present embodiment, the shield member 82 may also be used as the heat dissipation member to attain a reduction of the cost. Further, the shield member 82 is an example of a heat dissipation member.

Next, a fourth embodiment will be described. Further, the same constitutional elements as those of the first embodiment are assigned the same reference numerals and descriptions thereof will be omitted.

Figure 8:
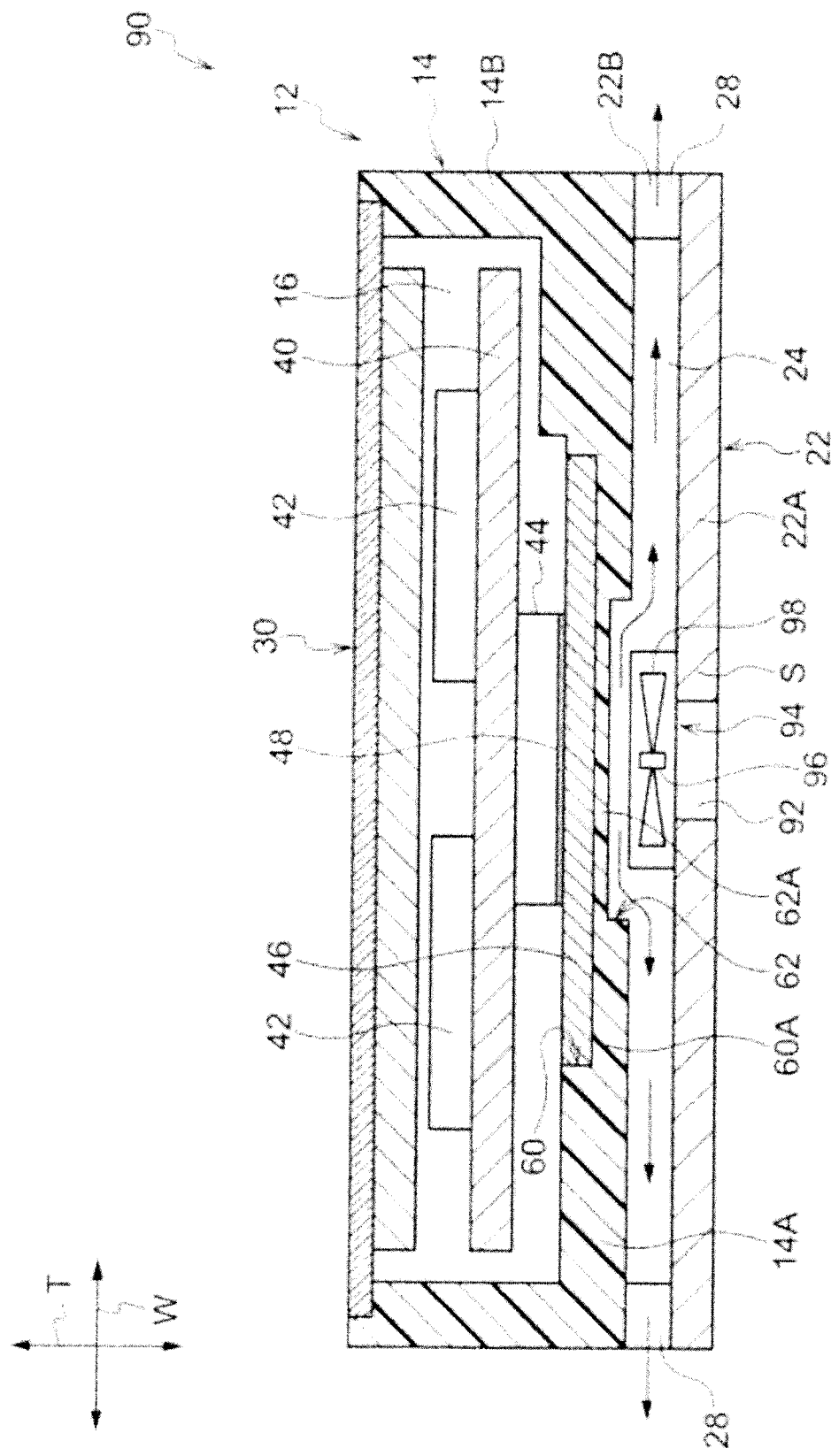
FIG. 8 is a cross-sectional view illustrating the electronic device according to a fourth embodiment and corresponds to FIG. 3.

As illustrated in FIG. 8, a blower 94 is disposed in the ventilation chamber 24 in an electronic device 90 according to a fourth embodiment. The blower 94 is disposed to face the electronic component 44 by interposing the thin wall portion 62A (partition wall portion 14A) therebetween. Further, the blower 94 includes a rotating shaft 96 and a plurality of blades 98 rotating integrally with the rotating shaft 96. The blower 94 is, for example, an axial blower which sends wind along the rotating shaft 96.

An intake port 92 is formed in the facing portion S of the rear cover 22. That is, the intake port 92 is disposed at a side opposite to the thin wall portion 62A (the partition wall portion 14A) with respect to the blower 94. In the meantime, the exhaust ports 28 are formed at both sides of the circumferential side wall 14B of the rear cover 22 in the width direction, respectively.

Here, when the blower 94 operates, outside air is introduced into the ventilation chamber 24 from the intake port 92 and the outside air introduced into the ventilation chamber 24 flows along the rotating shaft 96 to spray the outside air on the thin wall portion 62A. Accordingly, the thin wall portion 62A is cooled down. Then, the outside air sprayed on the thin wall portion 62A flows along the partition wall portion 14A and is exhausted from a pair of exhaust ports 28 formed in the circumferential side wall 22B of the rear cover 22 to the outside of the ventilation chamber 24.

As described above, in the present embodiment, the thin wall portion 62A is directly cooled down by the winds blown out from the blower 94. Accordingly, the cooling efficiency of the electronic component 44 may be increased.

Next, modified examples of the first to fourth embodiments will be described. Further, in the following, various modified examples will be described by exemplifying the first embodiment, but the modified examples may be appropriately applied to the second to fourth embodiments.

In the first embodiment, an example in which the thin wall portion 62A overlaps with the entirety of the electronic component 44 when viewing the partition wall portion 14A in the wall thickness direction is described, but the first embodiment is not limited to the example. For example, the thin wall portion 62A may be formed such that the thin wall portion 62A spans from one end 44A of the electronic component 44 to the other end 44B thereof when viewing the partition wall portion 14A in the wall thickness direction.

In such a configuration, as compared to a case where the partition wall portion 14A does not span from one end 44A of the electronic component 44 to the other end 44B, the heat dissipation efficiency of the heat dissipated from the electronic component 44 through the thin wall portion 62A to the ventilation chamber 24 may be increased. Further, the thin wall portion 62A may overlap with at least a portion of the electronic component 44 when viewing the partition wall portion 14A in the wall thickness direction.

Further, in order to give further details to supplement the thin wall portion 62A, in the first embodiment, an example is described in which the thin wall portion 62A is partially formed on the bottom wall portion 60A of the mounting recess 60, but the first embodiment is not limited to the example. The thin wall portion 62A may be formed in an entire area of the bottom wall portion 60A. That is, the thin wall portion 62A may be formed in at least a portion which faces the electronic component 44 among the bottom wall portion 60A.

Figure 9:
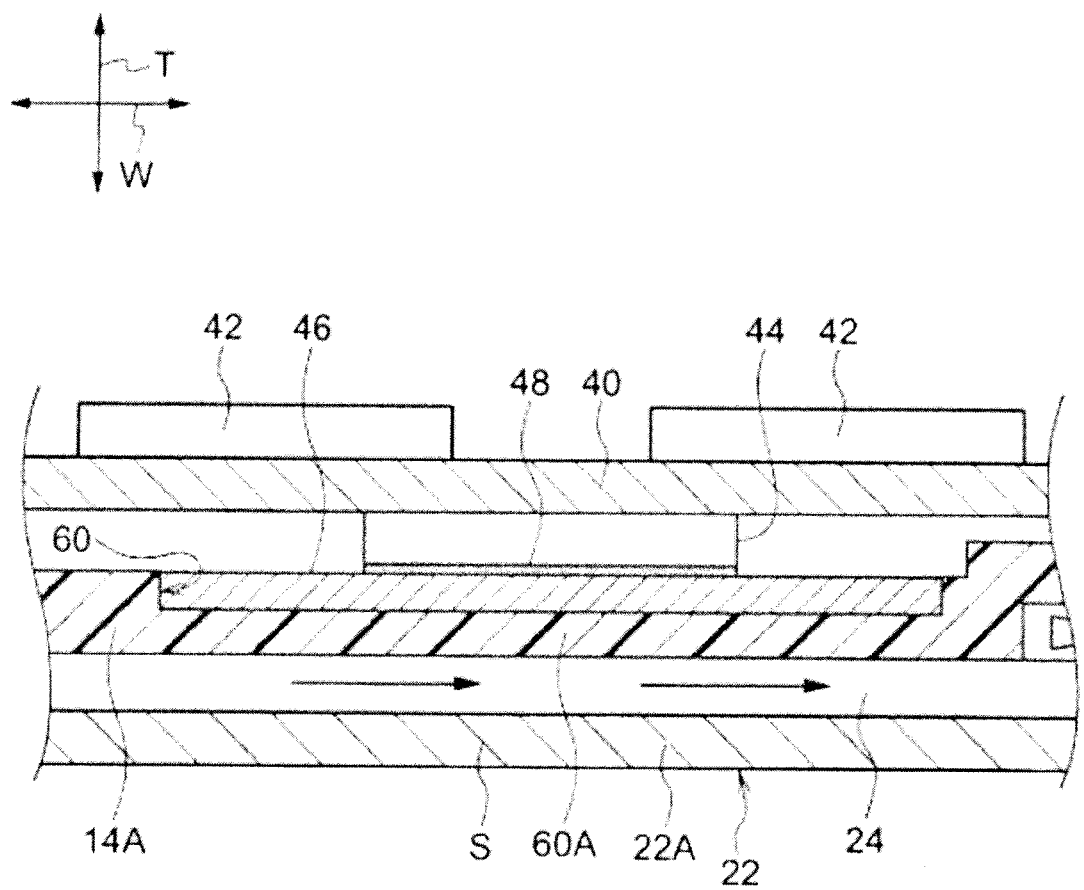
FIG. 9 is an enlarged cross-sectional view illustrating a modified example of the electronic device according to the first embodiment and corresponds to FIG. 3.

Further, in the first embodiment, an example in which the outer recess 62 is formed on the bottom wall portion 60A of the mounting recess 60 is described, but the first embodiment is not limited to the example. For example, as illustrated in FIG. 9, the outer recess 62 may be omitted. In this case, the bottom wall portion 60A of the mounting recess 60 may be regarded as a thin wall part.

Figure 10:
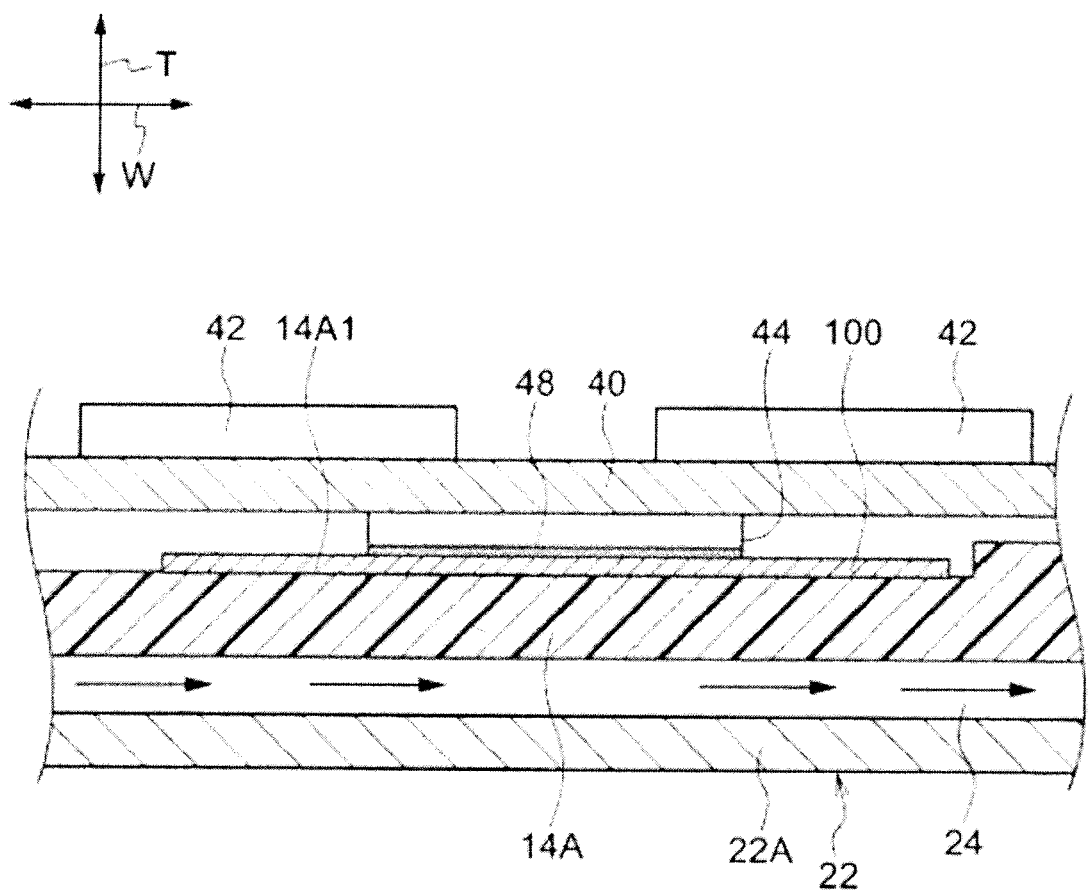
FIG. 10 is another enlarged cross-sectional view illustrating the modified example of the electronic device according to the first embodiment and corresponds to FIG. 3.

Further, in the first embodiment, an example in which the heat dissipation plate 46 is disposed on the mounting recess 60 formed in the partition wall portion 14A is described, but the first embodiment is not limited to the example. For example, as illustrated in FIG. 10, the mounting recess 60 may be omitted and the heat dissipation member 100 may be disposed along a surface 14A1 of the waterproof compartment 16 side in the partition wall portion 14A.

Further, in the first embodiment, an example in which the electronic component 44 is located at the central portion of the heat dissipation plate 46 is described, but the first embodiment is not limited to the example. The electronic component 44 may be located at, for example, a position spaced apart from the central portion of the heat dissipation plate 46.

Further, in the first embodiment, an example in which the electronic component 44 is attached to the heat dissipation plate 46 through the heat transfer member 48 is described, but the first embodiment is not limited to the example. For example, the heat transfer member 48 may be omitted and the electronic component 44 may be directly attached to the heat dissipation plate 46. Further, the electronic component 44 and the heat dissipation plate 46 may face with each other in a non-contacting fashion so as to allow the heat of the electronic component 44 to be transferred to the heat dissipation plate 46.

Further, in the first embodiment, an example in which the heat dissipation plate 46 is utilized as the heat dissipation member is described, but the first embodiment is not limited to the example. As for the heat dissipation member, a heat dissipation sheet formed in a sheet shape and made of a graphite sheet having a thermal conductivity higher than that of the partition wall portion 14A may be utilized. Further, various heating elements which generate heat and are not limited to the electronic component 44 may be attached to the heat dissipation plate 46. Further, the term of "sheet shape" means a state in which thickness is as thin as a paper, and the term of "plate shape" means a state in which thickness is thicker than the "sheet shape".

Further, a temperature sensor which detects temperature of, for example, the waterproof compartment 16, the partition wall portion 14A or the rear cover 22 may be installed in the electronic device 10. Also, the blower 50 may be operated when the temperature detected by the temperature sensor becomes a predetermined value or more and otherwise, the blower 50 may be stopped when the temperature detected by the temperature sensor becomes less than the predetermined value. Accordingly, it is possible to suppress an occurrence of the heat spot while reducing the power consumption of the blower 50.

Further, in the first embodiment, an example in which the casing 12 is formed by two members of the main body casing 14 and the rear cover 22 is described, but the first embodiment is not limited to the example. For example, a waterproof compartment and a ventilation chamber may be provided in a casing formed of a single member.

Further, the first embodiment may be applied to various electronic devices, for example, a tablet type personal computer, an electronic dictionary, or a game device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
   a heating element;
   a casing including a tightly sealed waterproof compartment where the heating element is disposed and a ventilation chamber being disposed adjacent to the waterproof compartment to allow outside air to flow;
   a heat dissipation member provided at a side of the waterproof compartment of a partition wall partitioning the waterproof compartment and the ventilation chamber,
   wherein the heating element is disposed on the heat dissipation member and a thickness of the partition wall at a position where at least the heating element is disposed is thinner than that of other portions of the partition wall, and
   wherein the heat dissipation member is formed in a plate shape or a sheet shape, a mounting recess on which the heat dissipation member is attached is formed at the side of the waterproof compartment in the partition wall, and the thin wall portion is formed in a bottom wall portion of the mounting recess;
   an inner recess, which forms the thin wall portion, formed at the side of the waterproof compartment in the bottom wall portion; and
   an accommodating recess, which is recessed above at least a portion of the inner recess and in which the heating element is received, formed in the heat dissipation member.

2. The electronic device according to claim 1, wherein the thin wall portion is configured to span from one end of the heating element to the other end thereof when viewing the partition wall in a wall thickness direction.

3. The electronic device according to claim 1, wherein heat dissipation member is a same size as the heating element when viewing the partition wall in the wall thickness direction.

4. The electronic device according to claim 1, further comprising
   an outer recess, which forms the thin wall portion, formed at a side of the ventilation chamber in the partition wall.

5. The electronic device according to claim 1, wherein the thin wall portion is configured to overlap with an entirety of the heating element when viewing the partition wall in the wall thickness direction.

6. The electronic device according to claim 1, wherein the heating element is attached to the heat dissipation member through a heat transfer member or configured to face the heat dissipation member.

7. The electronic device according to claim 1, wherein the heat dissipation member is configured to further extend outside of a parameter of the heating element.

8. The electronic device according to claim 7, wherein the heating element is located at a central portion of the heat dissipation member.

9. The electronic device according to claim 1, further comprising
an intake port and an exhaust port, that communicate with the ventilation chamber, formed in the casing, and
a blower, configured to cause outside air to flow along the partition wall, installed in the ventilation chamber.

10. The electronic device according to claim 9, wherein the blower is disposed to face the heating element by interposing the partition wall therebetween to spray outside air on the partition wall.

11. The electronic device according to claim 10, wherein the intake port is located at a side of the blower that is opposite to the partition wall.

12. The electronic device according to claim 9, wherein the intake port is disposed at one side of the heating element, and the exhaust port and the blower are disposed at the other side of the heating element when viewing the partition wall in the wall thickness direction.

13. The electronic device according to claim 1, wherein the casing includes a main body casing provided with the waterproof compartment and a cover attached to the main body casing to form the ventilation chamber.

14. An electronic device comprising;
a heating element;
a casing including sealed waterproof compartment where the heating element is disposed and a ventilation chamber being disposed adjacent to the waterproof compartment to allow outside air to flow;
a heat dissipation member provided at a side of the waterproof compartment of a partition wall partitioning the waterproof compartment and the ventilation chamber,
wherein the heating element is disposed on he heat dissipation member and a thickness of the partition wall at a position where at least the heating element is disposed is thinner than that of other portions of the partition wall; and
a substrate disposed in the waterproof compartment, wherein the heating element corresponds to an electronic component mounted on a side of the substrate facing the partition wall, and wherein the heat dissipation member is attached to the substrate and corresponds to a shield member covering the electronic component.

* * * * *